(12) United States Patent
Tseng

(10) Patent No.: US 6,261,901 B1
(45) Date of Patent: Jul. 17, 2001

(54) METHOD OF MANUFACTURING A DRAM CAPACITOR WITH A DIELECTRIC COLUMN

(75) Inventor: Horng-Huei Tseng, Hsinchu (TW)

(73) Assignee: Vabguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/609,266

(22) Filed: Jun. 30, 2000

(51) Int. Cl.⁷ .............................................. H01L 21/8242
(52) U.S. Cl. .............................................. 438/255
(58) Field of Search ..................... 438/255, 238, 438/253–256, 381, 393–399

(56) References Cited

U.S. PATENT DOCUMENTS 5,278,091 * 1/1994 Fazan et al. ........................ 438/398

* cited by examiner

Primary Examiner—Charles Bowers
Assistant Examiner—Craig Thompson
(74) Attorney, Agent, or Firm—Darby & Darby

(57) ABSTRACT

A method of manufacturing a capacitor of a dynamic random access memory cell is disclosed. The method includes forming a capacitor opening through a dielectric isolation interlayer to expose a buried contact area. A plug of conductive material is subsequently formed in a bottom portion of the capacitor opening and makes an electrical connection with the contact area. A conductive spacer is formed on the sidewall of the opening by depositing a conformal layer and anisotropically etching back, and such leaves a channel within the opening. A dielectric column is formed by filling the channel with dielectric material. The lateral surface of the dielectric column is then exposed by removing the laterally adjacent conductive spacer. Finally, first and second capacitor plates and a dielectric layer therebetween are formed within the capacitor opening and supported by the dielectric column, thereby completing the capacitor.

25 Claims, 7 Drawing Sheets

METHOD OF MANUFACTURING A DRAM CAPACITOR WITH A DIELECTRIC COLUMN

BACKGROUND OF THE INVENTION

1. Field of the Invention

This invention relates to semiconductor technology, and more particularly, to cell capacitors for use in dynamic random access memories (DRAMs).

2. Description of the Related Arts

The circuit density on integrated circuits has continually increased over the years due to innovations in process technologies. One particular device with increased density is the dynamic random access memory (DRAM), which is expected to have more than a billion memory cells (gigabits) by the year 2000. This higher density of memory cells is a result of improved high resolution photolithography and patterning by directional (anisotropic) plasma etching, which result in reduced device sizes. However, this reduction in device size is putting additional demand on the semiconductor processing technologies, and also on maintaining the electrical requirements, such as maintaining or increasing the capacitance of capacitors on DRAM devices.

These DRAM devices consist in part of an array of individual DRAM storage cells that store binary data (bits) as electrical charge on a storage capacitor. Further, the information is stored and retrieved from the storage capacitor by means of a single pass transistor in each memory cell, and by address and read/write circuits on the periphery of the DRAM chip. The pass transistor is usually a field effect transistor (FET), and the single capacitor in each cell is either formed in the semiconductor substrate as a trench capacitor, or built over the FET in the cell area as a stacked capacitor. To maintain a reasonable DRAM chip size and improved circuit performance, it is necessary to further reduce the area occupied by the individual cells on the DRAM chip. Unfortunately, as the cell size decreases, it becomes increasing more difficult to fabricate stacked or trench storage capacitors with sufficient capacitance to store the necessary charge to provide an acceptable signal-to-noise level for the read circuits (sense amplifiers) to detect. Accordingly, this is a continuing challenge to maintain sufficiently high storage capacitance despite decreasing cell area.

The principle way of increasing cell capacitance is through cell structure techniques. Such techniques include three-dimensional cell capacitors, such as trenched or stacked capacitors. This invention concerns methods of forming three-dimensional cell capacitors.

SUMMARY OF THE INVENTION

It is an object of the invention to provide a method of forming a three-dimensional cell capacitor having greater capacitance per unit area.

Another object of the invention is to provide a method of forming a capacitor integrated with self-aligned contact having increased electrode surface area.

According to one embodiment, a capacitor opening is formed through a dielectric isolation interlayer to expose a buried contact area. A plug of conductive material is subsequently formed in a bottom portion of the capacitor opening and makes an electrical connection with the contact area. A conductive spacer is formed on the sidewall of the opening by depositing a conformal layer and anisotropically etching back, and such leaves a channel within the opening. A dielectric column is formed by filling the channel with dielectric material. The lateral surface of the dielectric column is then exposed by removing the laterally adjacent conductive spacer. Finally, first and second capacitor plates and a dielectric layer therebetween are formed within the capacitor opening and supported by the dielectric column, thereby completing the DRAM cell capacitor.

Other objects, features, and advantages of the present invention will become apparent from the following detailed description which makes reference to the accompanying drawings.

DESCRIPTION OF THE PREFERRED EMBODIMENTS

Figure 1:
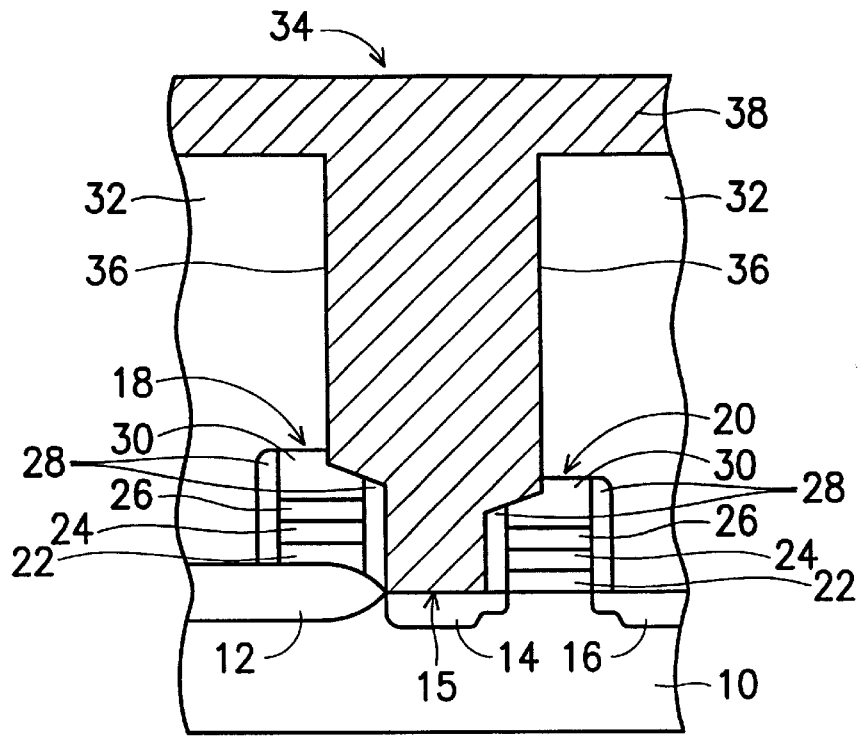
FIGS. 1–9 show cross-sectional views illustrative of various stages in the fabrication of a DRAM capacitor in accordance with a first embodiment of the present invention.

The present invention will be described in detail with reference to the accompanying drawings. Referring to FIG. 1, the method of the present invention begins by providing a semiconductor substrate 10. In the context of this document, the term "semiconductor substrate" is meant to include devices formed within a semiconductor wafer and the layers overlying the wafer. The term "substrate surface" is meant to include the upper most exposed layers on a semiconductor wafer, such as silicon surface and an insulating layer. The illustrated substrate includes an isolation region defined by isolation oxide 12 which is formed adjacent a substrate active area which includes diffusion regions 14, 16, received therein. A pair of conductive lines 18, 20, are formed over substrate 10 and constitute part of the preferred DRAM circuitry. Conductive lines 18, 20 are of standard construction and include an oxide layer 22, a polysilicon layer 24, and a silicide layer 26. Conductive lines 18, 20 also include respective sidewall spacers 28 and respective protective caps 30.

A first dielectric layer 32 is formed over substrate 10 and conductive lines 18, 20 as inter-layer dielectric (ILD) and is preferably planarized. Layer 32 preferably comprises an oxide material, such as borophosphosilicate glass (BPSG). An capacitor contact opening 34 is etched through layer 32 exposing the buried contact area 15. Such opening can be formed by a self-aligned contact etch with cap layers 30 and sidewall spacers 28 serving as etch stops, thus allowing self-alignment. A conventional plasma etch process such as reactive ion etching (RIE) can be used to create self-aligned contact opening 34. During subsequent processing steps, the storage node capacitor plate of the embodiment is fabricated to contact buried contact area 15.

Figure 2:
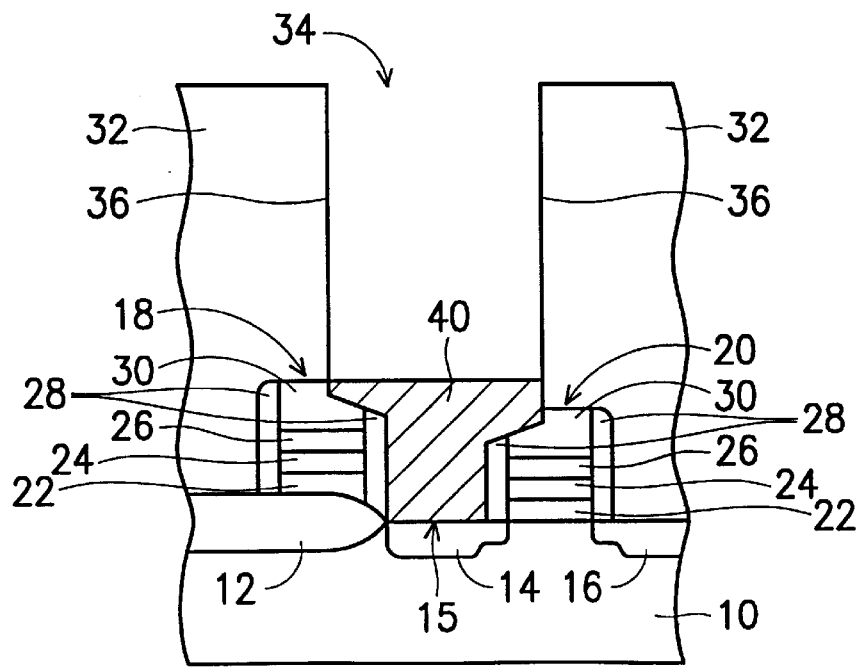

Next, a layer of electrically conductive material 38 is formed over substrate 10 and completely filling capacitor opening 34. A preferred conductive material is in-situ doped polysilicon. Referring to FIG. 2, conductive layer 38 is anisotropically blanket etched back to leave behind only material disposed in a bottom portion of capacitor opening 34. Accordingly, a conductive plug 40 is formed and makes an electrical connection with contact area 15. Conductive plug 40 preferably has an upper planar surface. The removal of conductive layer 38 can be accomplished by a plasma etch process such as reactive ion etch (RIE), and preferably exposes most of substantially vertical sidewall 36 of capacitor opening 34 as shown.

Figure 3:
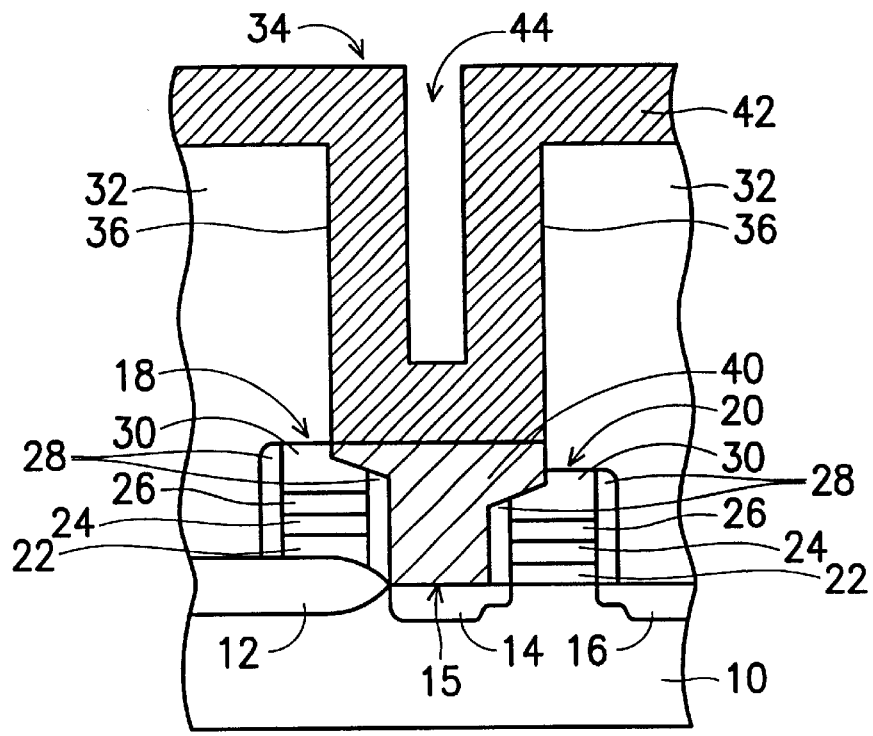

Referring to FIG. 3, another layer of electrically conductive material 42 is deposited on dielectric layer 32 and along the sidewall 36 of capacitor opening 34. As shown in FIG. 3, conductive layer 42 is formed to such a thickness as not to completely fill capacitor opening 34, and such leaves a channel 44 within the center of capacitor opening 34. A preferred conductive material is in-situ doped polysilicon.

Figure 4:
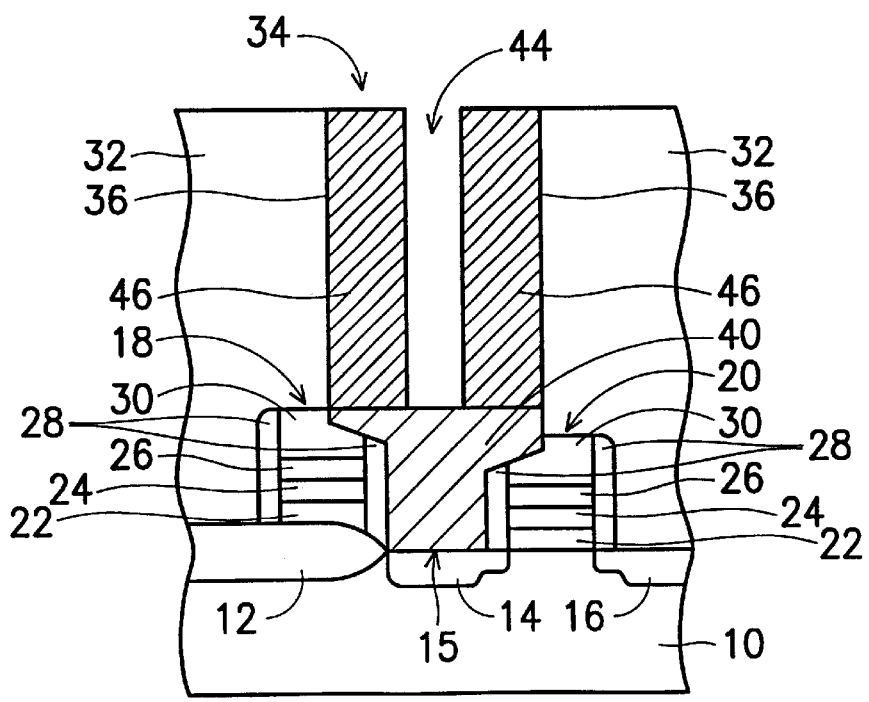

Referring to FIG. 4, conductive layer 42 is then etched back. An anisotropic reactive ion etching (RIE) process is used to etch conductive layer 42 to the surface of first dielectric layer 32. As a result of this etching, the residual portions of conductive layer form a sidewall spacer 46 on sidewall 36 of capacitor opening 34.

Figure 5:
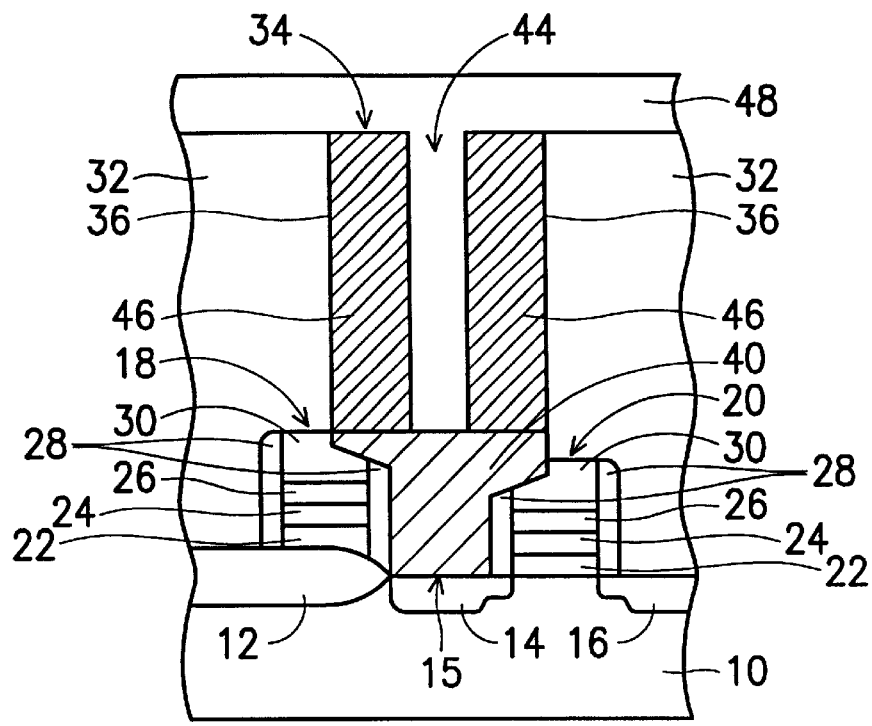

Referring to FIG. 5, a second dielectric layer 48 is deposited over the substrate and completely fills center channel 44. Examples of suitable materials for second dielectric layer 48 include silicon nitride and silicon oxide. Of course, other suitable dielectric materials can be used.

Figure 6:
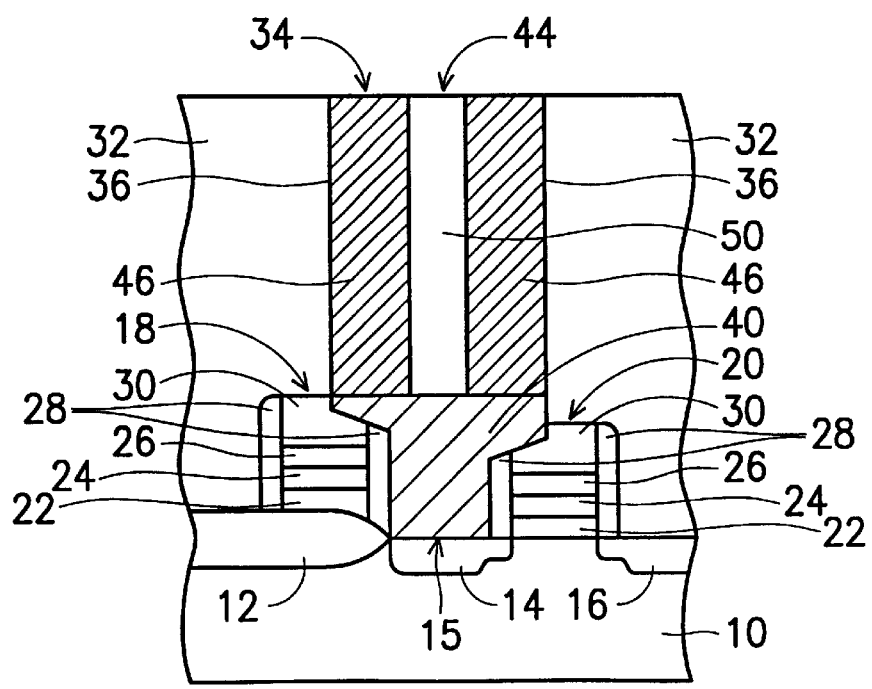

Referring to FIG. 6, portions of second dielectric layer 48 are removed to leave behind only material which was deposited within channel 44. Accordingly, the residual portions of second dielectric layer 48 are left in the form of a dielectric column 50 within capacitor opening 34. The removal of second dielectric layer 48 can be accomplished by conventional techniques such as abrasion of the substrate by chemical mechanical polishing (CMP) or through a dry etch back process. Other techniques can, of course, be used.

Figure 7:
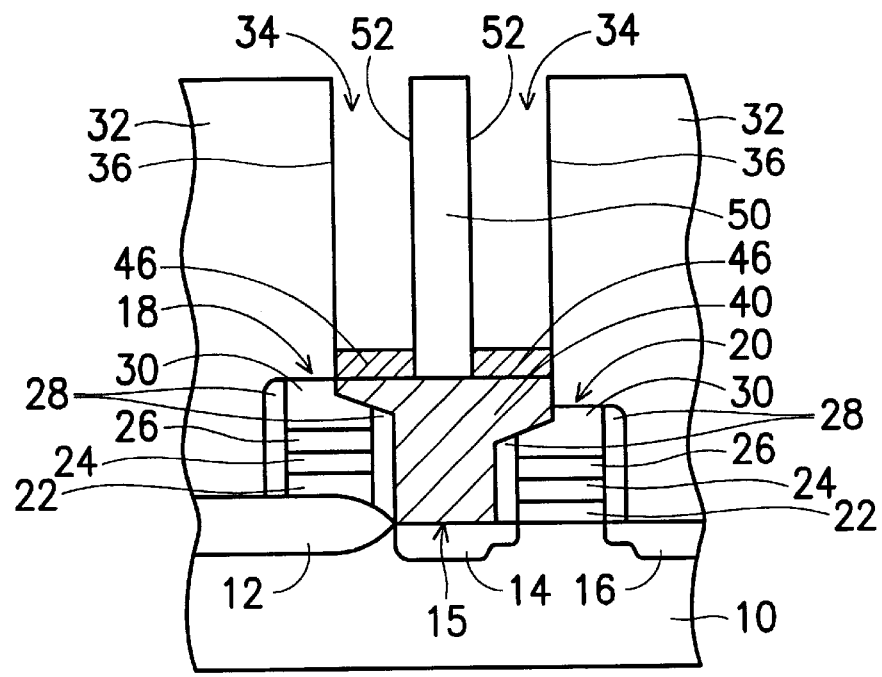

Referring to FIG. 7, portions (or entirety) of conductive sidewall spacer 46 are removed to reveal dielectric column 50 which was formed within capacitor opening 34. As shown in FIG. 7, dielectric column 50, which includes a lateral outer surface 52, is substantially centered in opening 34, spaced from sidewall 36 and supported by bottom plug 40. Column 50 can have circular or non-circular cross sections.

In a preferred embodiment, conductive sidewall spacer 46 is removed substantially selectively relative to dielectric column 50 and to a degree which is sufficient to expose most of lateral outer surface 52. Removal of conductive spacer 46 is accomplished through a wet or dry etch thereof (with a dry etch being preferred) relative to dielectric column 50 and dielectric layer 32. Where dielectric column 50 comprises silicon oxide, such etch would accordingly be selective relative to the silicon oxide. Where dielectric column 50 comprises silicon nitride, such etch would accordingly be selective relative to the silicon nitride. Such etch is also preferably selective relative to dielectric layer 32. Exemplary etch chemistries include one or more of the following: TMAH/H$_2$O mix, nitric/hydrofluoric mix, or 15% aqueous KOH.

Where conductive spacer 46 comprises polysilicon and the removal thereof is desired to be selective to oxide, the following etch chemistries are preferred: chlorine-based chemistries such as Cl$_2$, BCl$_3$, SiCl$_4$, or HCl; bromine-based chemistries such as HBr; and combinations of the above, e.g. HBr+HCl. Where conductive spacer 46 comprises polysilicon and the removal thereof is desired to be selective to nitride, a wet etch thereof is more preferred. In this illustrated example, and because no etch stop layer is utilized, the etching of conductive spacer 46 is preferably a timed etch.

Figure 8:
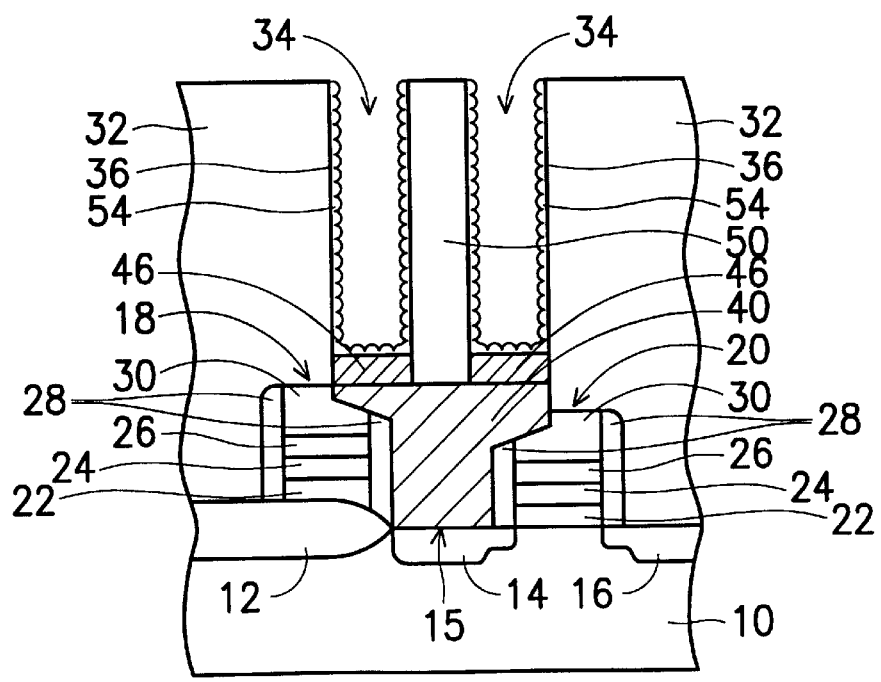

Referring to FIG. 8, a first capacitor plate structure 54 is formed within capacitor opening 34 at least a portion of which is supported by column 50. Accordingly, at least some of plate structure 54 is formed over capacitor opening sidewall surface 38 and lateral outer surface 52a. First capacitor plate structure 54 can comprise any suitable material. Exemplary and preferred materials include polysilicon, polysilicon in combination with a hemispherical grain (HSG) polysilicon, or in-situ doped HSG. The selected material is preferably formed over the substrate and deposited within opening 34 to a thickness from between about 300 to 600 Å. Subsequently, such material is planarized as by suitable mechanical abrasion of the substrate to remove such material from outwardly of capacitor opening 34. Such material can also be removed through a dry etch back process. Preferably, during such removal, capacitor contact opening 34 is filled with photoresist to prevent removed particles from falling into the opening during planarization or to prevent etching of the material inside opening 34 during the dry etch back process. The photoresist is subsequently removed.

Figure 9:
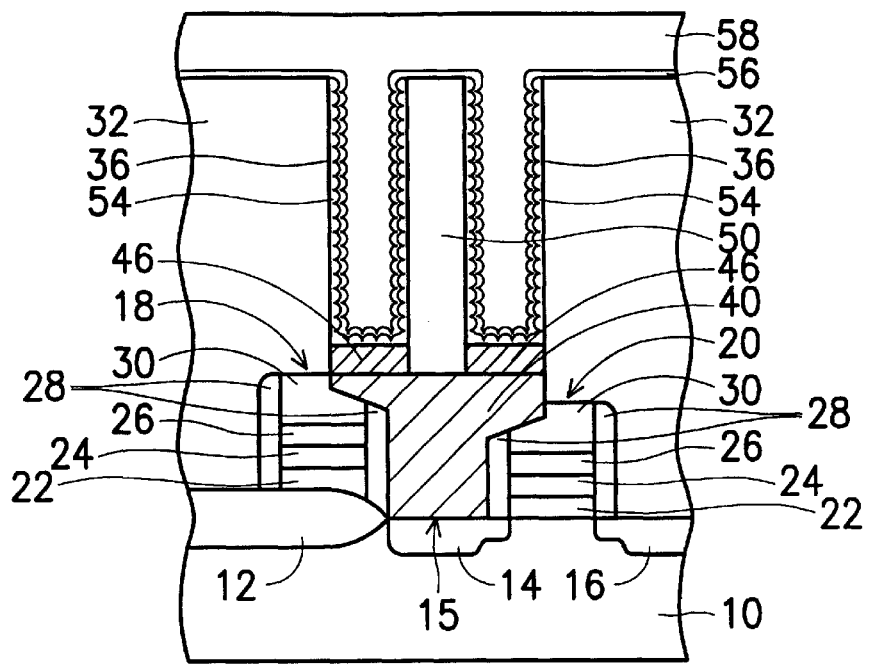

Referring to FIG. 9, a capacitor dielectric layer 56 is then deposited along the surface of first capacitor plate structure 54. Dielectric layer 56 is preferably formed of either a double film of nitride/oxide, a triple film of oxide/nitride/oxide, or any other high dielectric film such as Ta$_2$O$_5$. Subsequently, a second capacitor plate structure 58 is formed over dielectric layer 56 to provide a top storage electrode. Typically, such second capacitor plate structure 58 is formed of doped polysilicon or in-situ doped polysilicon. Thus, the resulting structure forms a three-dimensional cell capacitor that provides an enlarged electrode surface area. This increased electrode surface area of the capacitor increases the capacitance of the capacitor. Therefore the present invention increases the performance of the capacitor, thereby allowing a smaller sized capacitor to be used in the DRAM cell.

Figure 10:
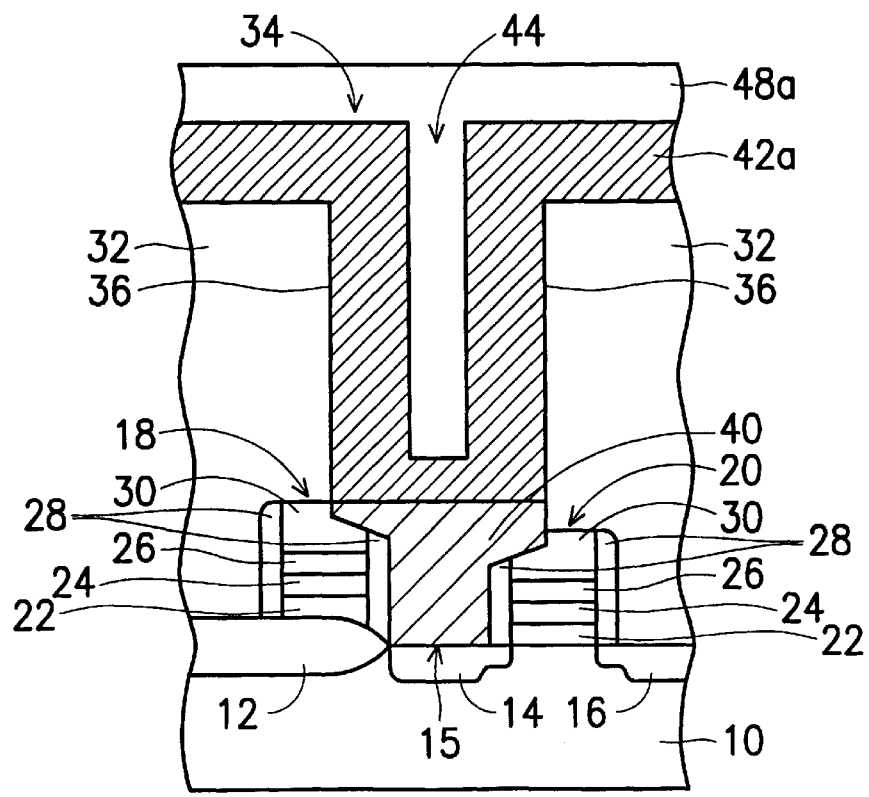
FIGS. 10–14 show cross-sectional views illustrative of various stages in the fabrication of a DRAM capacitor in accordance with a second embodiment of the present invention.

Referring to FIG. 10, an alternate preferred embodiment is illustrated. Like numbers from the first described embodiment are utilized where appropriate, with differences being indicated with the suffix "a". Accordingly, a layer of conductive material 42a is formed on dielectric layer 32 and within capacitor opening 34 to occupy less than all of the capacitor opening and to leave a center channel 44 therein. Thereafter, instead of etching conductive layer 42a for sidewall spacers as illustrated in the first embodiment, a dielectric layer 48a is directly formed on conductive layer 42a and completely fills channel 44.

Figure 11:
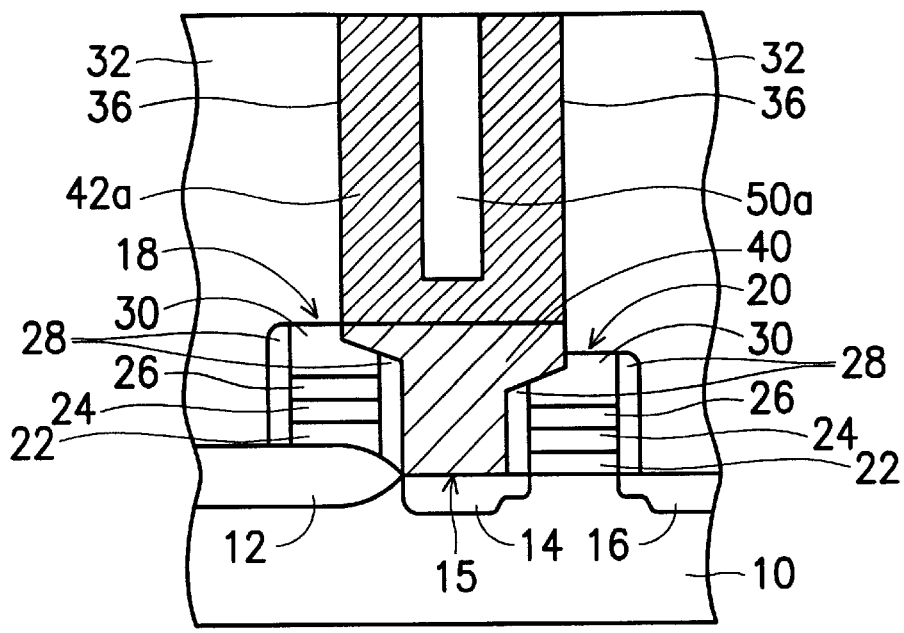

Referring to FIG. 11, portions of dielectric layer 48a and conductive layer 42a are removed to leave behind only material which was formed within capacitor opening 34. Accordingly, the residual portions of dielectric layer 48a are left in the form of a dielectric column 50a within capacitor opening 34. The removal can be accomplished by conventional techniques such as abrasion of the substrate by chemical mechanical polishing (CMP) or through a dry etch back process. Other techniques can, of course, be used.

Figure 12:
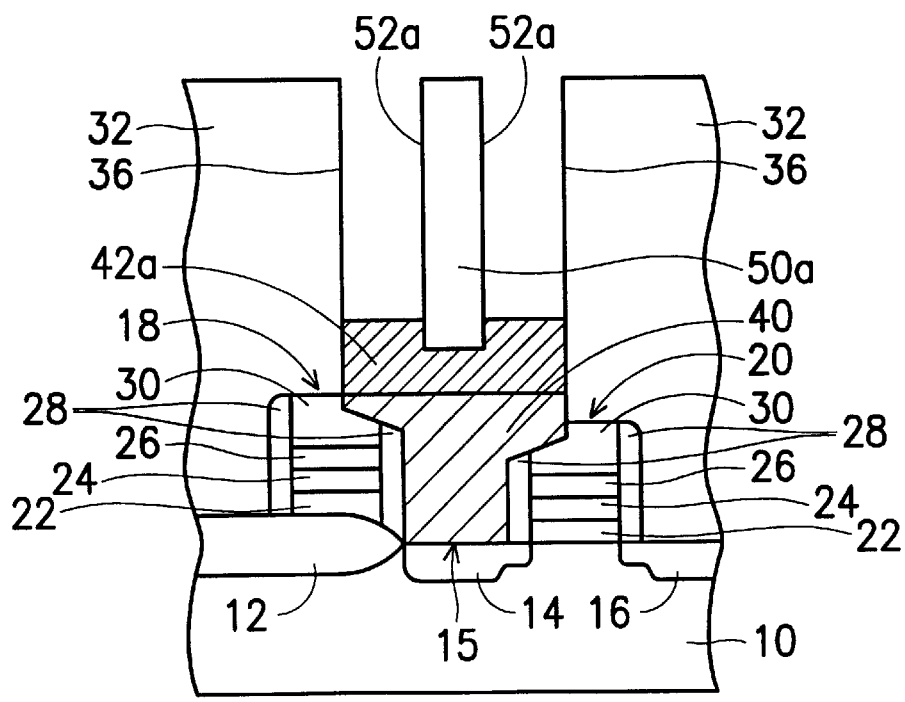

Referring to FIG. 12, an amount of conductive layer 42a laterally adjacent sidewall surface 36 is removed to expose dielectric column 50a. Dielectric column 50a, which includes a lateral outer surface 52a, is spaced from sidewall 36 of capacitor opening and is supported by the residual portion of conductive layer 42a. In this illustrated example, the etching of conductive layer 42a is preferably a timed etch and is conducted to a degree sufficient to leave at least some conductive material lateral outward of and below dielectric column 50a to support the same.

Figure 13:
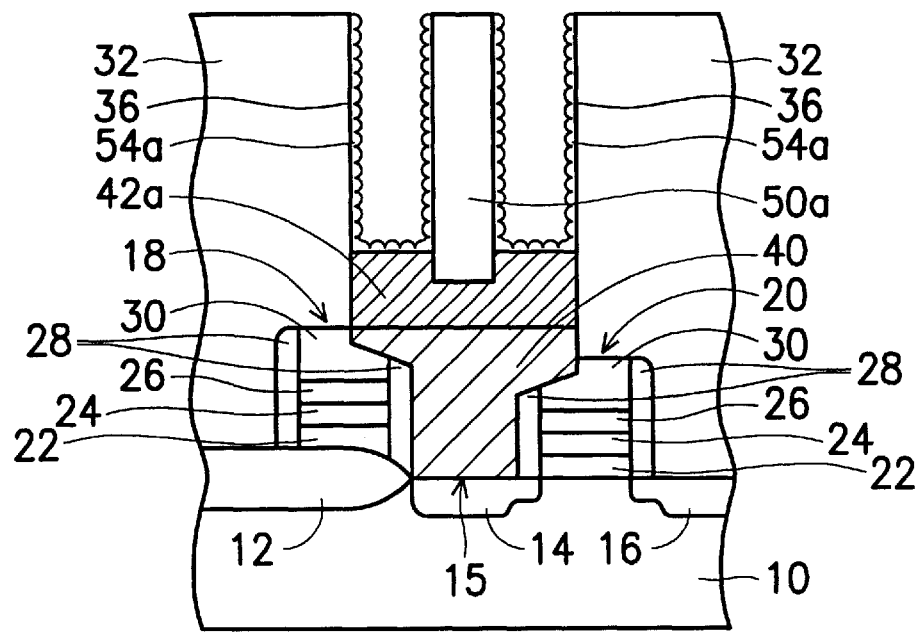

Referring to FIG. 13, a first capacitor plate structure 54a is formed within capacitor opening 34 at least a portion of which is supported by column 50a. Accordingly, at least some of plate structure 54a is formed over capacitor opening sidewall surface 38 and lateral outer surface 52a.

Figure 14:
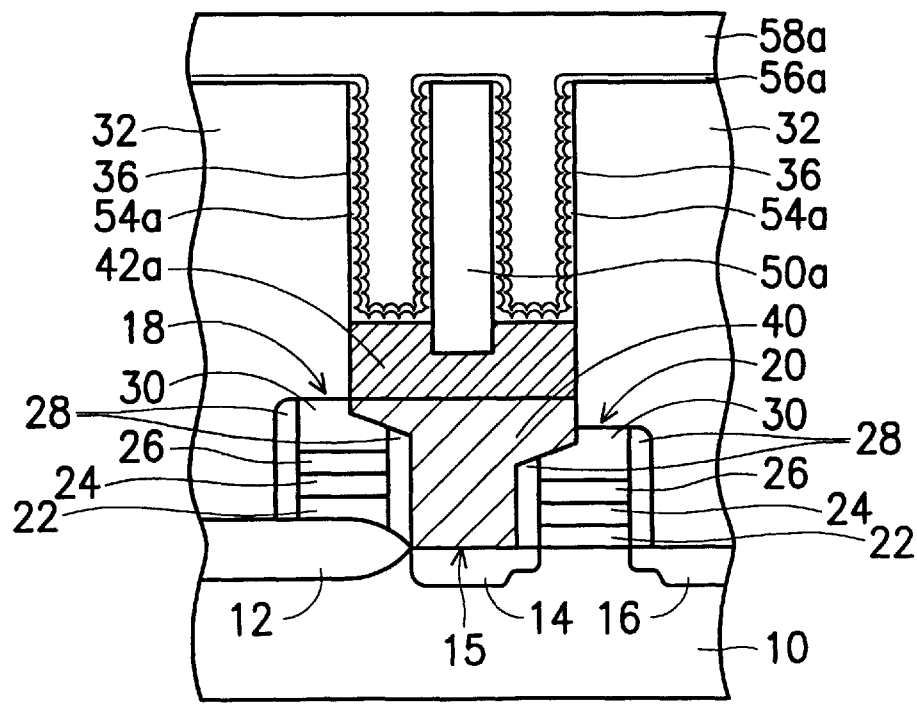

Referring to FIG. 14, a capacitor dielectric layer 56a is then deposited along the surface of first capacitor plate structure 54a, and a second capacitor plate structure 58a is formed over dielectric layer 56a to complete the capacitor.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A method for forming a capacitor on a semiconductor substrate, said method comprising the steps of:
   forming a dielectric isolation interlayer above said semiconductor substrate;
   forming an opening in said interlayer to expose a contact area of said substrate;
   forming a conductive plug in a bottom portion of said opening to make an electrical connection with said contact area;
   forming a conductive spacer on a sidewall of said opening, said conductive spacer defining a channel in said opening;
   forming an dielectric column in said channel by filling said channel with dielectric material;
   removing at least a portion of said conductive spacer thereby exposing a lateral surface of said dielectric column;
   forming a first capacitor plate structure within said opening and over said lateral surface of said dielectric column;
   forming a capacitor dielectric layer over said first capacitor plate structure; and
   forming a second capacitor plate structure over said capacitor dielectric layer.

2. The method as claimed in claim 1, wherein said dielectric isolation interlayer comprises borophosphosilicate glass (BPSG).

3. The method as claimed in claim 1, wherein said opening is etched in a self-aligned manner to said contact area.

4. The method as claimed in claim 1, wherein said plug is formed of in-situ doped polysilicon.

5. The method as claimed in claim 1, wherein said spacer is formed of in-situ doped polysilicon.

6. The method as claimed in claim 1, wherein said dielectric column is formed of silicon oxide.

7. The method as claimed in claim 1, wherein said dielectric column is formed of silicon nitride.

8. The method as claimed in claim 1, wherein said dielectric column is substantially centered in said opening.

9. The method as claimed in claim 1, wherein said first capacitor plate structure is formed of polysilicon, or a hemispherical grain (HSG) polysilicon.

10. The method as claimed in claim 1, wherein said capacitor dielectric layer is formed of $Ta_2O_5$.

11. The method as claimed in claim 1, wherein said capacitor dielectric layer is formed of a double film of nitride/oxide.

12. The method as claimed in claim 1, wherein said capacitor dielectric layer is formed of a triple film of oxide/nitride/oxide.

13. The method as claimed in claim 1, wherein said second capacitor plate structure is formed of doped polysilicon.

14. A method for forming a capacitor on a semiconductor substrate, said method comprising the steps of:
   forming a dielectric isolation interlayer above said semiconductor substrate;
   forming an opening in said interlayer to expose a contact area of said substrate;
   forming a first conductive layer on said interlayer and completely filling said opening;
   etching said first conductive layer to form a conductive plug in a bottom portion of said opening to make an electrical connection with said contact area;
   forming a second conductive layer on said interlayer and along a sidewall of said opening;
   anisotropically etching said second conductive layer to form a spacer on a sidewall of said opening, said conductive spacer defining a channel in said opening;
   forming an dielectric column in said channel by filling said channel with dielectric material;
   removing at least a portion of said conductive spacer thereby exposing a lateral surface of said dielectric column;
   forming a first capacitor plate structure within said opening and over said lateral surface of said dielectric column;
   forming a capacitor dielectric layer over said first capacitor plate structure; and
   forming a second capacitor plate structure over said capacitor dielectric layer.

15. The method as claimed in claim 14, wherein said dielectric isolation interlayer comprises borophosphosilicate glass (BPSG).

16. The method as claimed in claim 14, wherein said opening is etched in a self-aligned manner to said contact area.

17. The method as claimed in claim 14, wherein said first conductive layer is formed of in-situ doped polysilicon.

18. The method as claimed in claim 14, wherein said second conductive layer is formed of in-situ doped polysilicon.

19. The method as claimed in claim 14, wherein said second conductive layer is etched by using a reactive ion etching (RIE) process.

20. The method as claimed in claim 14, wherein said dielectric column is formed of silicon oxide.

21. The method as claimed in claim 14, wherein said dielectric column is formed of silicon nitride.

22. The method as claimed in claim 14, wherein said dielectric column is substantially centered in said opening.

23. A method for forming a capacitor on a semiconductor substrate, said method comprising the steps of:
   forming a dielectric isolation interlayer above said semiconductor substrate;
   forming an opening in said interlayer to expose a contact area of said substrate;
   forming a first conductive layer on said interlayer and completely filling said opening;
   etching said first conductive layer to form a conductive plug in a bottom portion of said opening to make an electrical connection with said contact area;
   forming a second conductive layer on said interlayer and along a sidewall of said opening;
   forming a layer of dielectric material on said second conductive layer and completely filling said opening;

removing portions of said dielectric layer and said second conductive layer outwardly of said opening such that residual portions of said dielectric layer are left in the form of a column within said opening;

removing portions of said second conductive layer laterally adjacent to said dielectric column thereby exposing a lateral surface of said dielectric column;

forming a first capacitor plate structure within said opening and over said lateral surface of said dielectric column;

forming a capacitor dielectric layer over said first capacitor plate structure; and forming a second capacitor plate structure over said capacitor dielectric layer.

24. The method as claimed in claim 23, wherein said opening is etched in a self-aligned manner to said contact area.

25. The method as claimed in claim 23, wherein said dielectric column is substantially centered in said opening.

* * * * *

UNITED STATES PATENT AND TRADEMARK OFFICE
CERTIFICATE OF CORRECTION

PATENT NO. : 6,261,901 B1
DATED : July 17, 2001
INVENTOR(S) : Horng-Huei Tseng

It is certified that error appears in the above-identified patent and that said Letters Patent is hereby corrected as shown below:

<u>Title page,</u>
Item [73], Assignee, change, "Vabguard International" to -- Vanguard International --.

Signed and Sealed this

Ninth Day of April, 2002

Attest:

JAMES E. ROGAN
*Attesting Officer*     *Director of the United States Patent and Trademark Office*